(12) United States Patent
Chen et al.

(10) Patent No.: US 10,790,205 B2
(45) Date of Patent: Sep. 29, 2020

(54) OVERLAY STRUCTURE AND METHOD OF FABRICATING THE SAME

(71) Applicant: TAIWAN SEMICONDUCTOR MANUFACTURING CO., LTD., Hsinchu (TW)

(72) Inventors: Feng-Pin Chen, Taichung (TW); Te-Chia Ku, Taichung (TW); Chien-Kwen Chen, Taichung (TW); Chi-Chang Wu, Taichung (TW); Cheng-Ming Ho, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/244,229

(22) Filed: Jan. 10, 2019

(65) Prior Publication Data
US 2020/0105629 A1    Apr. 2, 2020

Related U.S. Application Data

(60) Provisional application No. 62/737,120, filed on Sep. 27, 2018.

(51) Int. Cl.
*H01L 21/66* (2006.01)
*G03F 7/20* (2006.01)
(Continued)

(52) U.S. Cl.
CPC .......... *H01L 22/32* (2013.01); *G03F 7/70633* (2013.01); *H01L 22/20* (2013.01); *H01L 23/544* (2013.01); *G01N 23/2251* (2013.01); *G01N 2223/401* (2013.01); *G01N 2223/418* (2013.01); *H01J 2237/2816* (2013.01); *H01L 21/682* (2013.01); *H01L 2223/5446* (2013.01); *H01L 2223/54426* (2013.01)

(58) Field of Classification Search
CPC ....... H01L 22/32; H01L 22/20; H01L 23/544; H01L 21/682
See application file for complete search history.

(56) References Cited

U.S. PATENT DOCUMENTS

| | | | | |
|---|---|---|---|---|
| 6,809,420 | B1* | 10/2004 | Wong | H01L 22/34 257/773 |
| 9,305,822 | B2* | 4/2016 | Chang | H01L 21/308 |

(Continued)

*Primary Examiner* — Seahvosh Nikmanesh
(74) *Attorney, Agent, or Firm* — McClure, Qualey & Rodack, LLP

(57) ABSTRACT

A method includes: forming overlay structures at scribe lines of a wafer, each side of a die region of the wafer is disposed with at least one of the overlay structures, each of the overlay structures comprises at least one feature and at least one recess disposed above the feature, the feature and the recess are respectively disposed at a first and second layers of the wafer, the recess exposes a portion of the feature vertically aligned with the recess; acquiring an image of the overlay structures; measuring a first dimension and a second dimension of a first portion and a second portion of the recess, respectively; determining an overlay between the first and second layers of an edge region of the wafer based on an average of differences between the first and second dimensions; and modifying a subsequent lithography step to compensate for the overlay.

20 Claims, 17 Drawing Sheets

(51) Int. Cl.
*H01L 23/544* (2006.01)
*H01L 21/68* (2006.01)
*G01N 23/2251* (2018.01)

(56) References Cited

U.S. PATENT DOCUMENTS

2016/0313116 A1* 10/2016 Ghinovker .......... G03F 7/70633
2017/0069461 A1* 3/2017 Borodovsky ....... H01J 37/1474
2017/0269481 A1* 9/2017 Borodovsky ......... G03F 7/2037

* cited by examiner

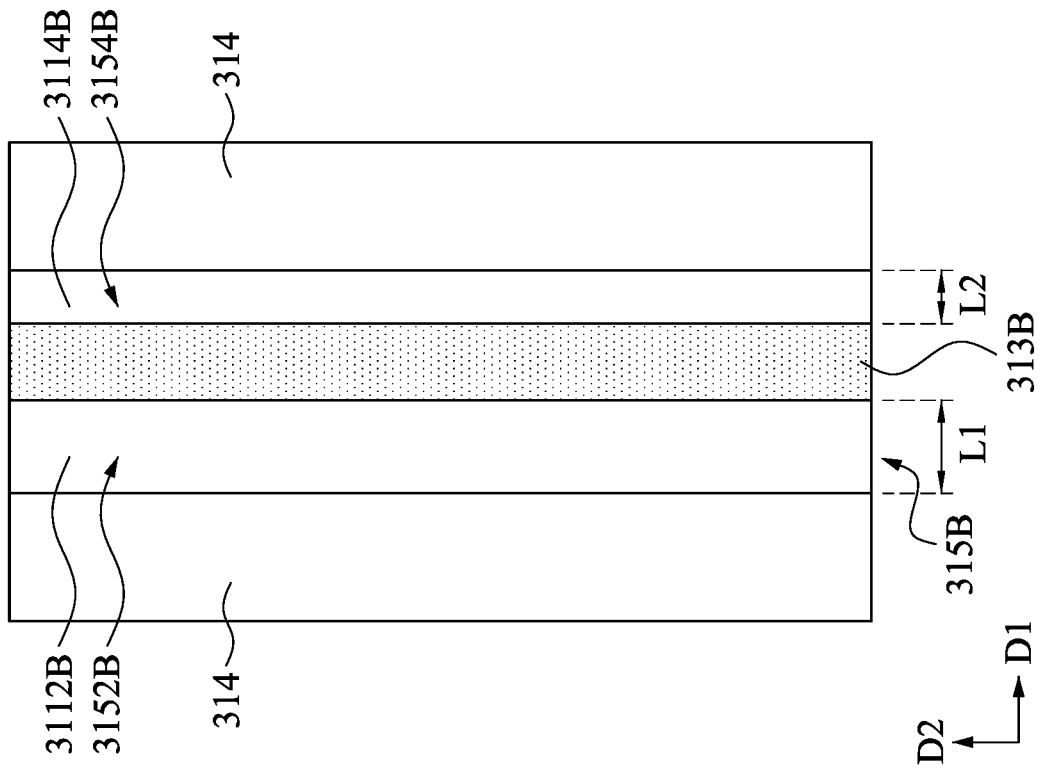
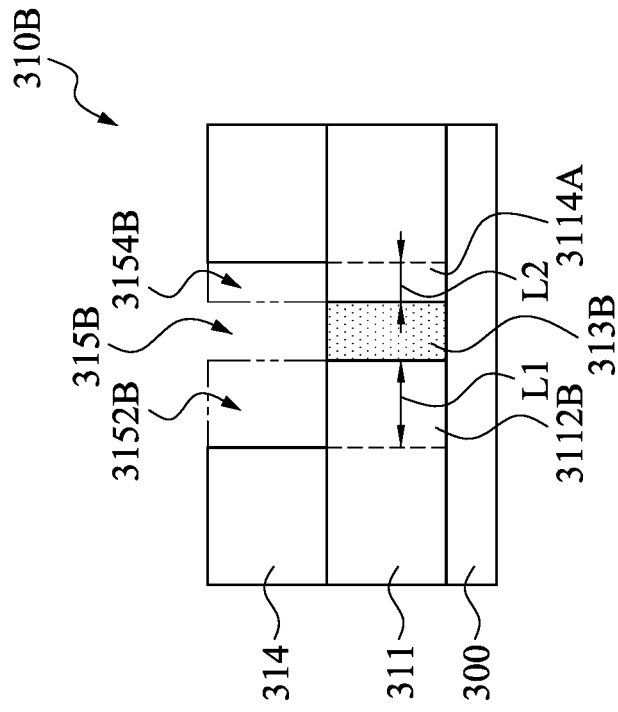
Fig. 9A
Fig. 9B

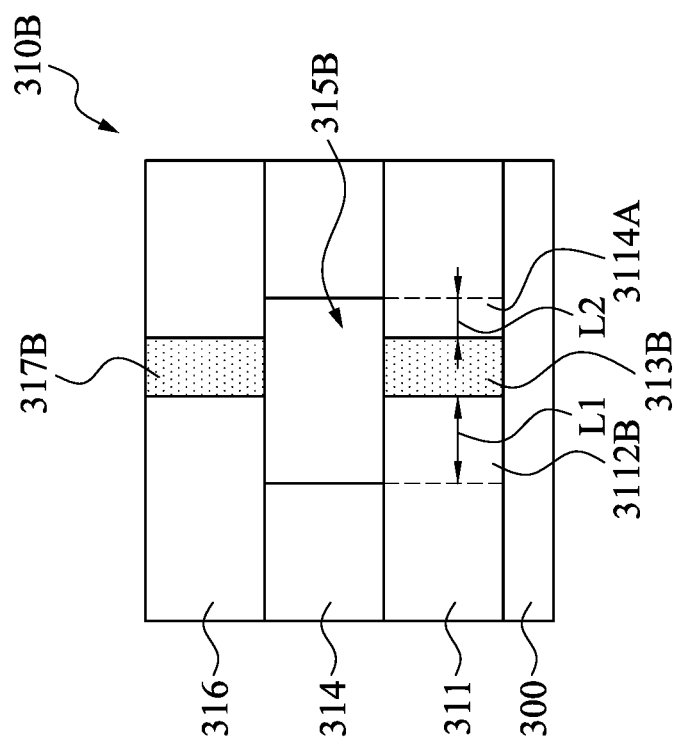

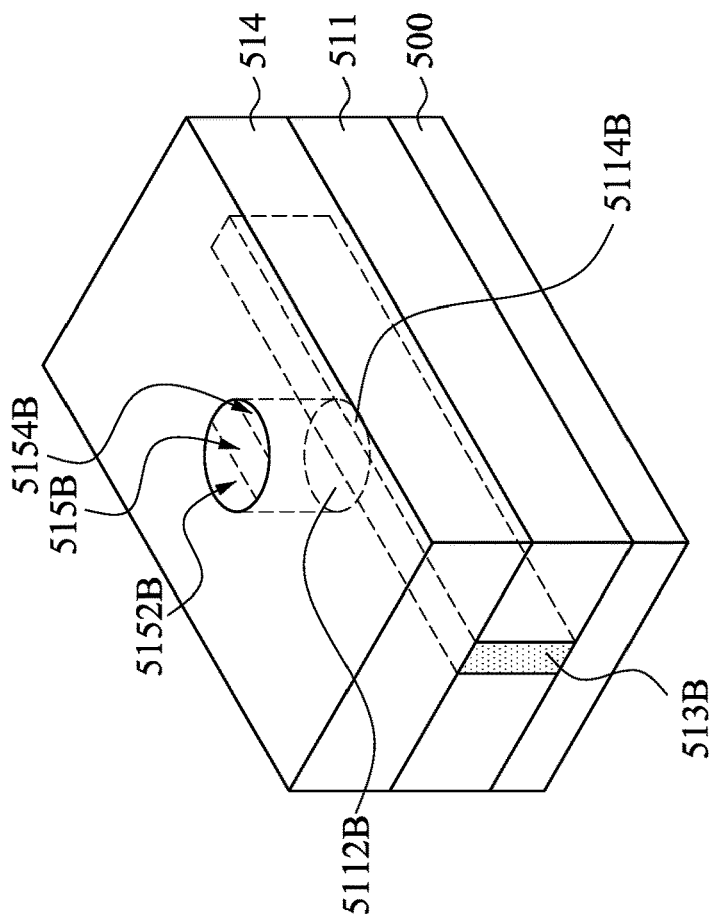
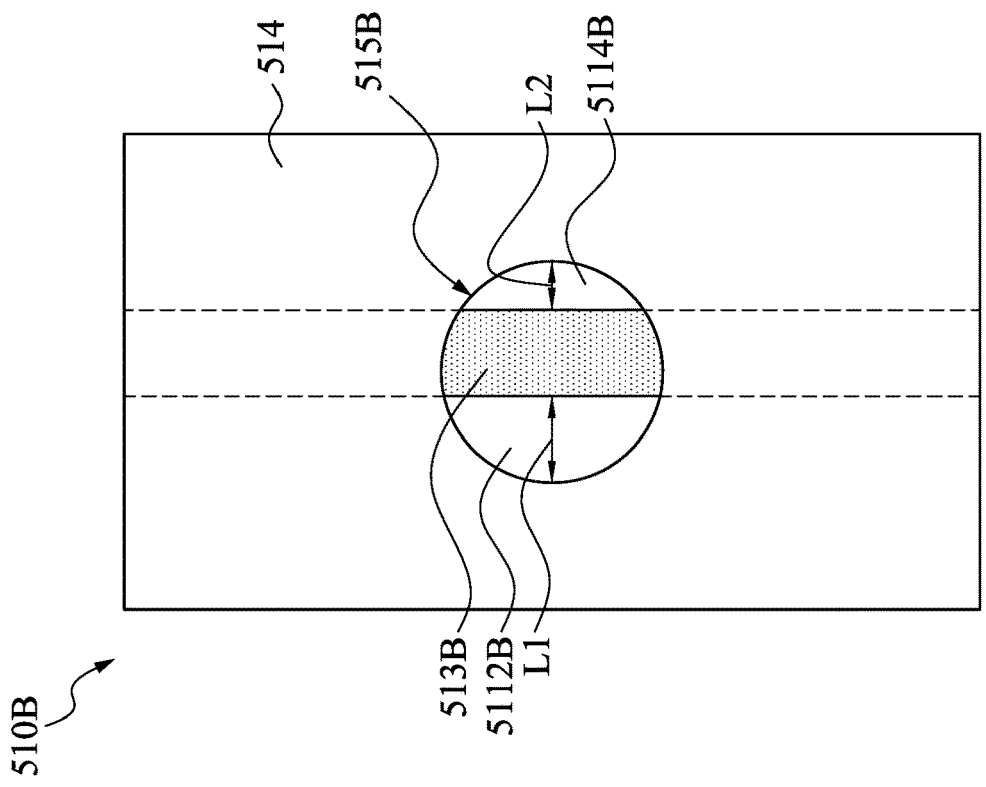
Fig. 12B
Fig. 12A

OVERLAY STRUCTURE AND METHOD OF FABRICATING THE SAME

PRIORITY CLAIM AND CROSS-REFERENCE

This application claims priority to U.S. Provisional Application Ser. No. 62/737,120, filed Sep. 27, 2018, which is herein incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9A is a top view of the overlay structure in FIG. 8.

FIG. 9B is a cross section view of the overlay structure in FIG. 9A.

FIG. 10 is a cross section view of the overlay structure in FIG. 8 added with a third dielectric layer after correcting the overlay shift.

FIG. 12A is a top view of an overlay structure according to some embodiments of the present disclosure.

FIG. 12B is a perspective view of the overlay structure in FIG. 12A.

DETAILED DESCRIPTION

Figure 1:
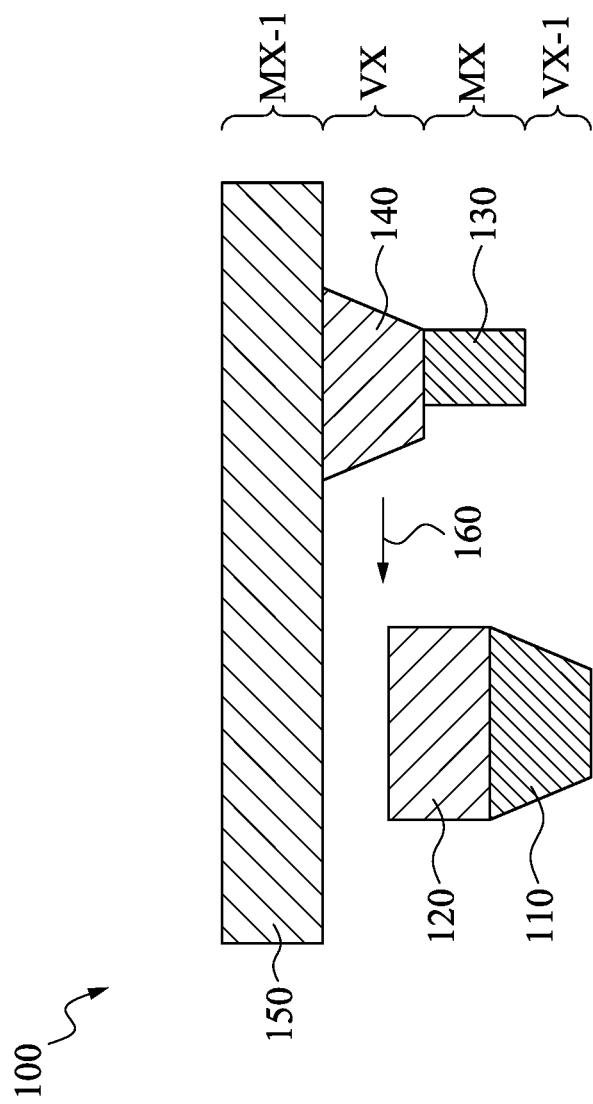
FIG. 1 is a cross section view of a portion of a wafer according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to advance, traditional fabrication systems and methods may encounter various problems. For example, as semiconductor device sizes continue to shrink, such as beyond the N28 (28-nanometer) technology node, wafer warpage may become a problem. For example, a metal layer may be formed on the surface of a wafer. The metal layer may include vias and metal lines. The wafer (and the metal layer formed thereon) may be bending or warped, for example, due to a stress it experiences.

The warpage of the wafer may cause problems such as short between contact and poly gate and via-induced-metal-bridge (VIMB), particularly for dies located at or near an edge of the wafer. The via-induced-metal-bridge (VIMB) may cause unintended electrical shorting and may lead to potential chip failure or other defects. Consequently, device yields may be low, or customers may receive defective dies that should not have been sent out, which erodes customer satisfaction and confidence in the manufacturer.

In various embodiments, the edge region of the wafer may be considered an outermost 10%, or 5%, or 1% of the wafer (e.g., wafer area), respectively. The conventional overlay marks may not formed within the outermost region of the wafer where many dies are located within, and the overlay measurement derived from the conventional overlay mark cannot reflect real overlay shift at the wafer edge due to the wafer warpage. Thus, overcompensation may occur in a subsequent process.

According to the various aspects of the present disclosure, an electronic microscope is used to acquire an image of a portion of a wafer, and digital image processing is performed subsequently to the acquired image, in order to detect overlay problems. In some embodiments, the image is acquired by a Scanning Electron Microscope (SEM) tool. The SEM tool shoots out electrons that interact with atoms or particles of the portion of the wafer that is being electronically scanned. This produces various signals that contain information about the surface topography and/or material composition of the portion of the wafer being scanned. If any overlay problems exist, they may be compensated for (or corrected) in later lithography fabrication steps, as discussed in more detail below.

FIG. 1 is a cross section view of a portion of a die region 100. The cross-section view shown in FIG. 1 is what a SEM image intend to capture. The die region 100 is located at the edge of a wafer and is prone to the adverse effects due to the wafer warpage. For example, referring to FIG. 1, the portion of the die region 100 includes a portion of an interconnect structure, which includes a via hole 110 in a Vx−1 layer, a metal line 120 in the Mx layer. The metal line 120 is disposed over the via hole 110. The portion of the die 100 also includes a metal line 130 in the Mx layer, a via 140 in the Vx layer, and a metal line 150 in a Mx+1 layer. The via hole 140 is disposed over the metal line 130, and the metal line 150 is disposed over the via hole 140.

As illustrated in FIG. 1, neither via hole 110 nor the metal line 120 are meant to be in direct physical contact with the metal line 130, the metal line 150 and the via hole 140. However, due to the wafer warpage discussed above, lithography processes performed to form the via hole 140 may have substantial overlay shift. In other words, the via hole 140 may be formed to be shifted to the left of the metal line 130, rather than being directly above and vertically aligned with the metal line 130. This overlay shift may be represented by the arrow 160 pointing to the left of the via hole 140. Often times, the overlay shift between the via hole 140 and the metal line 130 (due to the wafer warpage) may cause the via hole 140 to come into direct physical contact with the metal line 120.

Figure 2:
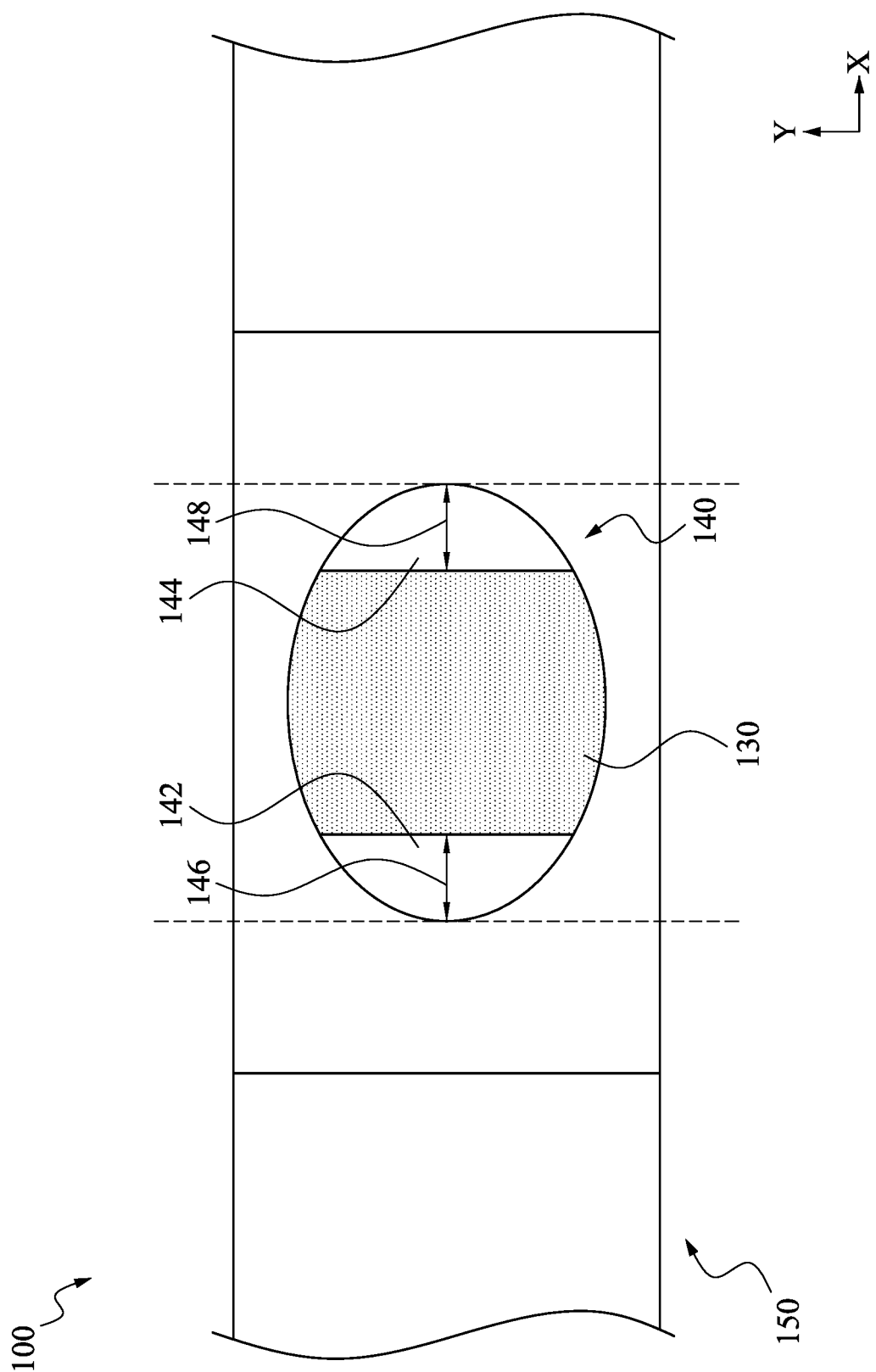
FIG. 2 is a top view of a portion of a wafer according to various embodiments of the present disclosure.

FIG. 2 is a top view of the portion of the wafer in FIG. 1. The metal line 130 in the Mx layer, the via hole 140 in the Vx layer, and a trench of the metal line 150 in the Mx+1 layer is illustrated. The SEM process is performed after the metal line 130 in the Mx layer and the via hole 140 in the Vx layer has been defined, and the trench of the metal line 150 in the Mx+1 layer has been defined, but the via hole 140 and the trench of the metal line 150 above the via hole 140 have not been filled with a conductive material to finish the forming of the via and the metal line yet. As such, the SEM process can "see through" the trench of the metal line 150 in the Mx+1 layer and the via hole 140 in the Vx layer, and "see" an exposed portion of the metal line 130 in the Mx layer.

In the embodiment shown in FIG. 2, the trench of the metal line 150 extends mostly along an X-direction, while the metal line 130 extends mostly along a Y-direction that is perpendicular to the X-direction. Since the via hole 140 and the trench of the metal line 150 are both "open" at this point, the metal line 130 formed below the via hole 140 is exposed. The portion of the via hole 140 that exposes the metal 130 may be considered to be vertically aligned with the metal line 130. However, it can be seen from FIG. 2 that some portions of the via hole 140 are not vertically aligned with the metal line 130. For example, a portion 142 of the via hole 140 is disposed to the "left" of the metal line 130, and another portion 144 of the via hole 140 is disposed to the "right" of the metal line 130, neither of which is vertically aligned with the metal line 130. This is because the via hole 140 has a greater lateral dimension in the X-direction than the metal line 130, and thus some portions of the via hole 140 are not located directly above the metal line 130.

In a SEM image, these two portions 142 and 144 of the via hole 140 shown in FIG. 2 have a different visual appearance (e.g., darker) than the rest of the via hole 140. According to the various aspects of the present disclosure, these two portions 142 and 144 of the via hole 140 are identified and the overlay between the via hole 140 and the metal line 130 there below are determined based on the size comparisons between these two portions 142 and 144.

Ideally, if the overlay between the via hole 140 and the metal line 130 had been perfect, then the portion 142 and the portion 144 of the via hole 140 should be substantially the same size. In other words, if the via hole 140 is aligned with the metal line 130 in a best case scenario, then the metal line 130 would "bisect" the via hole 140 symmetrically in a top view, which would leave the portions 142 and 144 disposed on opposite sides of the metal line 130 substantially equal to one another. As such, the degree of overlay between the via hole 140 and the metal line 130 (e.g., how well the via hole 140 is vertically aligned with the metal line 130) can be determined based on a geometric comparison between the portions 142 and 144 of the via hole 140. For example, one way to compare the portions 142 and 144 of the via hole 140 is to compare their maximum lateral dimensions in the X-direction. As shown in FIG. 2, the portion 142 has a maximum lateral dimension 146, and the portion 144 has a maximum lateral dimension 148, where the maximum lateral dimension 146 and 148 may be defined as the widest distance (in the X-direction) between the edges of the portions 142 and 144 and the edges of the metal line 130 closest to them, respectively.

In order to accurately measure the dimensions 146 and 148, the SEM image needs to be digitally processed to enhance the contrast between the metal line 130 and the portions 142 and 144 of the via hole 140. Otherwise, the original image acquired from the electronic microscope scan may lack clarity for the portions 142 and 144 to be clearly distinguished from their surrounding elements, such as the metal line 130. According to some embodiments of the present disclosure, the SEM image for processing contains pixels having varying gray levels, and a gray level threshold is defined based on the gray level distribution. As discussed above, the portions 142 and 144 of the via hole 140 are substantially darker than the rest of the areas in the SEM image. In other words, the pixels that make up the portions 142 and 144 of the via hole 140 are represented by the pixels below the threshold. The SEM image is filtered in a binary manner based on the threshold. This process may be referred to as a "thresholding" analysis, and it may be performed by using any suitable computerized tools capable of performing digital image processing.

Based on the previous discussion, it can be seen that the overlay problems may be detected from a top view of a structure including a feature which exposed by a hole above the feature by an electronic microscope, and the overlay shift may be determined by performing digital image processes on the acquired image. Therefore, according to the various aspects of the present disclosure, an overlay structure that includes a feature in a first layer and a recess in a second layer are provided for determining the overlay between the first and the second layers, and the overlay is then utilized for correcting the process parameters that will applied in a third layer, as will be discussed in more detail below. In comparison, conventional semiconductor systems and methods of measuring overlay typically involve overlay marks that are physically formed on wafers, for example in a test line of a wafer. These overlay marks may come in different shapes and sizes, for example in a box-in-box configuration. Whereas using the overlay marks to measure overlay involves an optics-oriented methodology (e.g., optically "seeing" whether an inner box is located within an outer box), the present disclosure involves an electronic microscopic scan.

Using the electronic microscopic scan (and digital image processing) to measure overlay offers several advantages over the traditional optical overlay mark methodology. For example, the optical overlay mark methodology requires doing object matching in "special" locations, but this does not apply to the electronic microscopic scan. Another advantage is that the electronic microscopic scan methodology can directly examine a "current" layer, whereas the optical overlay mark methodology needs to do an indirect examination by comparing with a previous layer. Yet another benefit of the electronic microscopic scan methodology discussed above is that any overlay problems, once detected, can be quickly corrected or compensated for in a later fabrication stage. Fabrication process parameters can be adjusted in these subsequent fabrication stages to account for, or compensate for, any overlay problems that have been detected, for example, between the via hole 140 and the metal line 130 shown in the embodiment in FIG. 1 and FIG. 2.

Figure 3A:
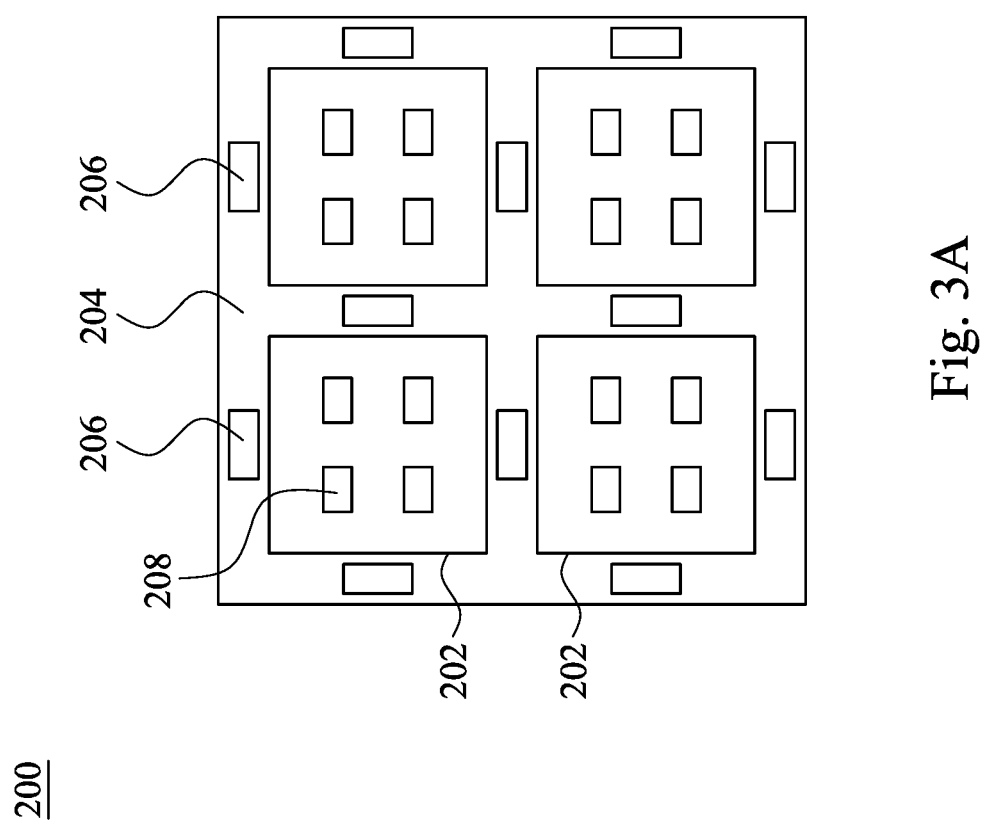
FIG. 3A is a top view of a wafer according to various embodiments of the present disclosure.

FIG. 3A is a top view of a photomask 200 according to various embodiments of the present disclosure. The photomask 200 is operable to project a plurality of patterns to different layers of a wafer in a photolithography process. In some embodiments shown in FIG. 3A, the photomask 200 includes a plurality of die regions 202 each surrounded by a scribe line region 204. Overlay regions 206 are disposed in the scribe line region 204. Each overlay region 206 includes an overlay pattern. In some embodiments, as illustrated in FIG. 3A, the photomask 200 includes four die regions 202. Each side of a die region 202 is disposed with one overlay regions 206. In some other embodiments, each side of a die region 202 may be disposed with more than one overlay region 206. The photomask 200 also includes device patterns disposed in device regions 208 that each correspond to different portions of a semiconductor device, or different portions of different semiconductor devices. The semiconductor device(s) may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistor, bipolar junction transistors (BJT), laterally diffused MOS (LDMOS) transistors, high power MOS transistors, or other type of transistors.

In order to forming the overlay structure as described above, the overlay regions 206 of a first photomask as an embodiment of the photomask 200 may include a first overlay pattern corresponding to a feature in a first layer of a wafer. As an example, the feature may be the metal line 130 shown in the embodiment of FIG. 1. The overlay region 206 of a second photomask as another embodiment of the photomask 200 may include a second overlay pattern corresponding to a recess in a second layer of a wafer. As an example, the recess may be the via hole 140 shown in the embodiment of FIG. 1. Therefore, the first overlay pattern and the second overlay pattern are respectively transferred from the first and the second photomask to a first layer and a second layer of a wafer to form a feature and a recess above the feature. Thus, an overlay structure including a feature exposed by a recess above the feature is formed in the overlay region 206 disposed in the scribe line region 204 of the wafer. The overlay shift between the first layer and the second layer of a wafer can be detected by acquiring and processing an image of the overlay structure in the overlay region 306 by a scanning electronic microscope tool.

Figure 3B:
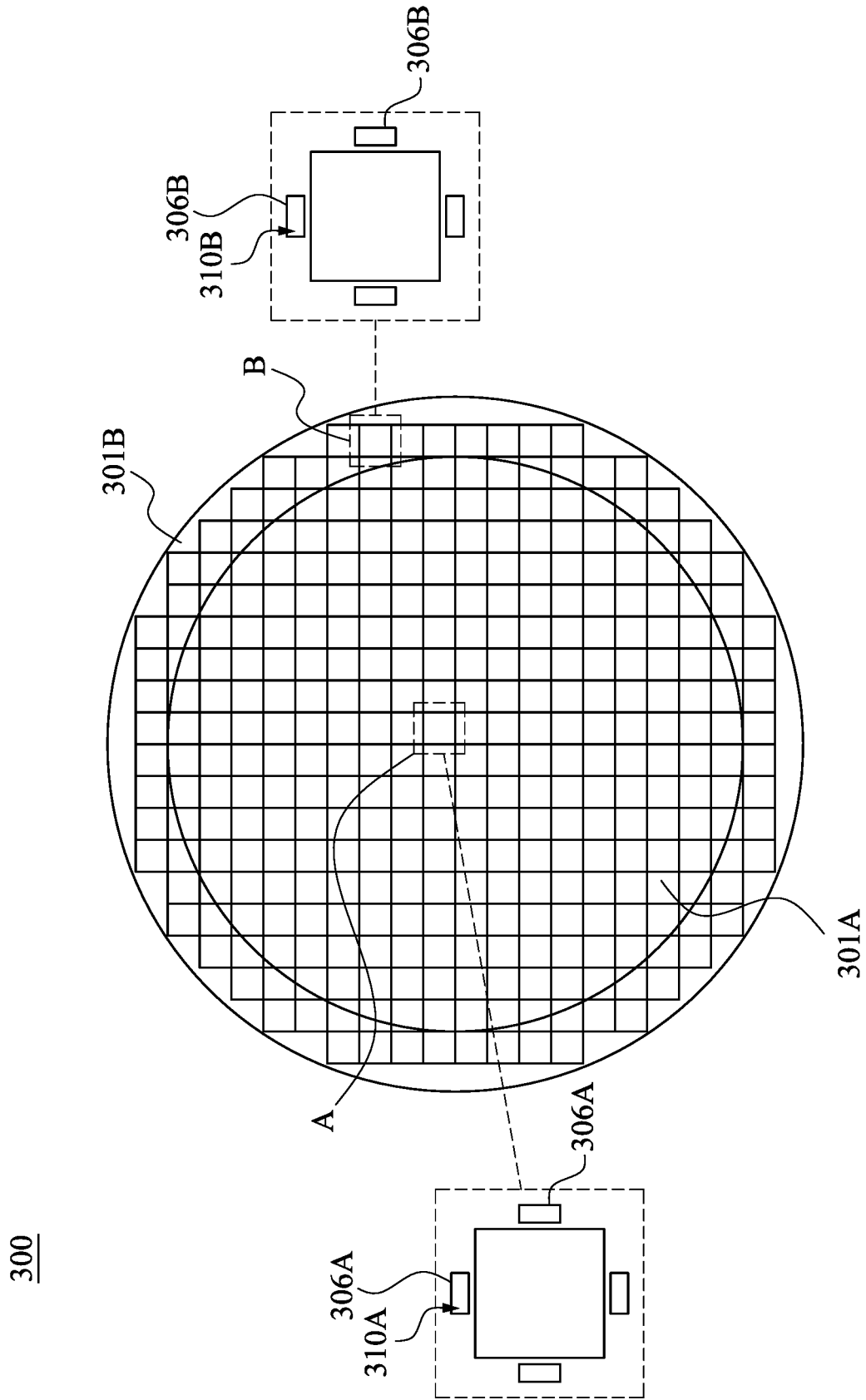
FIG. 3B is a top view of a photomask for fabricating the overlay structure according to various embodiments of the present disclosure.

FIG. 3B is a top view of a wafer 300 including overlay structures 310A and 310B according to various embodiments of the present disclosure. The wafer 300 is a silicon wafer. In some embodiments, the wafer 300 is doped with a P-type dopant such as boron. In some other embodiments, the wafer 300 is doped with an N-type dopant such as phosphorous or arsenic. The wafer 300 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the wafer 300 could include an epitaxial layer (epi layer), may be strained for performance enhancement, and may include a silicon-on insulator (SOI) structure.

The wafer 300 includes a first zone 301A and a second zone 301B surrounding the first zone 301A. The second zone 301B may correspond to the edge region of the wafer 300. In some embodiments, the second zone 301B is about the outermost 10%, or 5%, or 1% of the wafer 300 (e.g., wafer area), as described above. The photomask 200 (see FIG. 3A) is used in a photolithography process to transfer overlay patterns to the wafer 300 to form overlay structure, for example, a feature in a first layer and a recess in a second layer above the feature, as will be described in detail below. The photolithography process may include depositing a photoresist layer on a layer of the wafer; projecting the images of the overlay patterns and device patterns onto the photoresist layer to form a patterned photoresist layer, using the patterned photoresist layer as a mask, patterning the layer of the wafer through an etching process, such as dry etching or wet etching; and removing the photoresist layer after the overlay patterns and device patterns are transferred onto the layer of the wafer, respectively.

For the sake of illustration and comparison, merely a portion of the overlay structure 310A in the overlay region 306A in the first zone 301A (e.g., the region A in FIG. 3B) and a portion of the overlay structure 310B in the overlay region 306B in the second zone 301B (e.g., the region B in FIG. 3B) will be illustrated in the following description. In other words, the region A and the region B may denote two portions of the wafer 300 that experienced different level of overlay shift, for example, dominantly caused by process-induced overlay error and the wafer warpage, respectively. Various embodiments of the overlay structures 310B will be described with references made to FIGS. 5-10.

Figure 4:
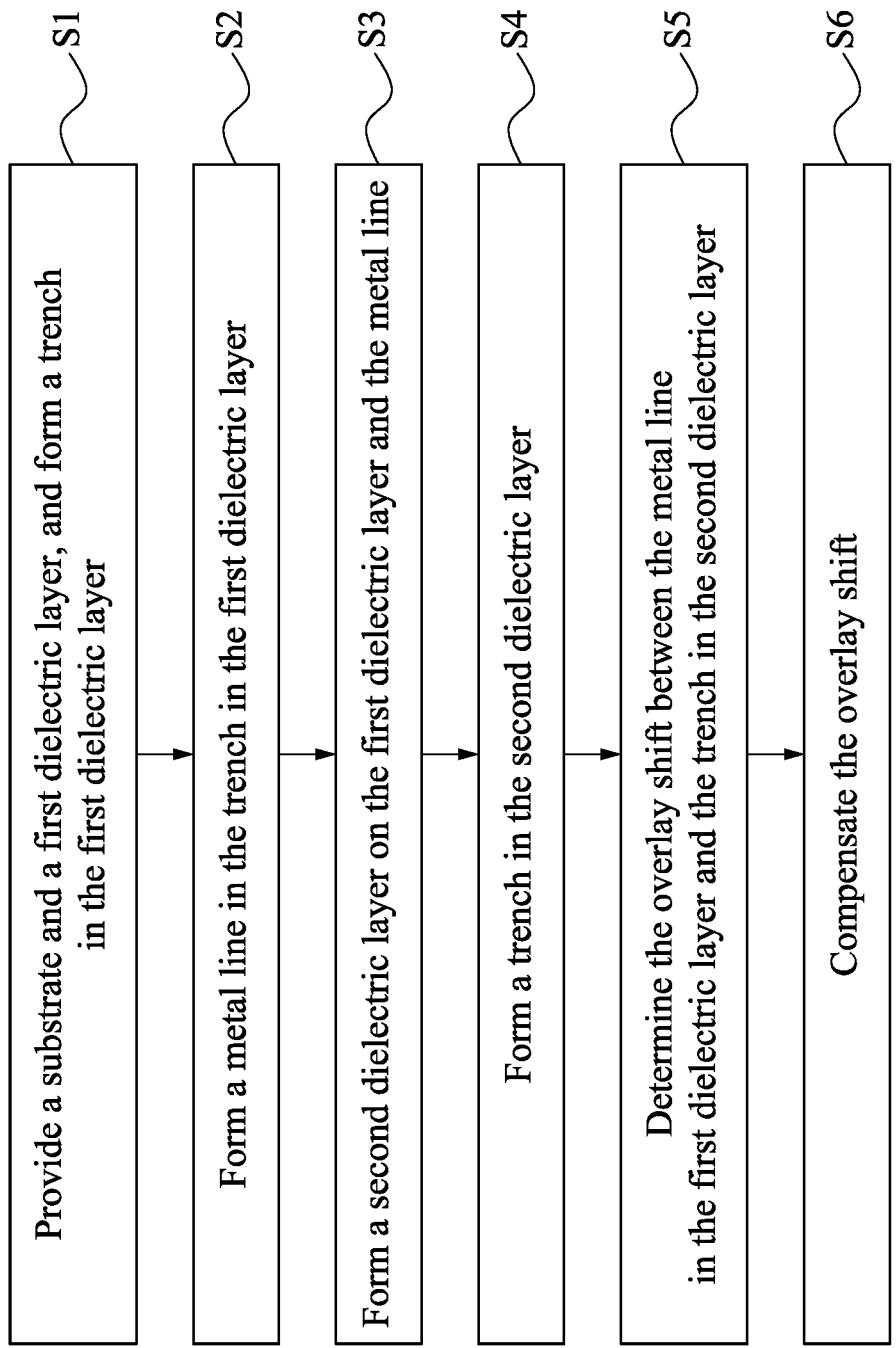
FIG. 4 is a flow chart of the method of fabricating an overlay structure and compensating the overlay according to various embodiments of the present disclosure.

FIG. 4 is a flow chart of the method of fabricating an overlay structure 310A and 310B and compensating the overlay according to various embodiments of the present disclosure. FIGS. 5-8 are the perspective views of the intermediate stages of the fabrication of overlay structures 310A and 310B according to some embodiments of the present disclosure. FIG. 9A is a top view of the overlay structure 310B in FIG. 8. FIG. 9B is a cross section view of the overlay structure 310B in FIG. 9A. FIG. 10 is a cross section view of the overlay structure 310B in FIG. 8 added with a third dielectric layer 316 after correcting the overlay shift.

Figure 5:
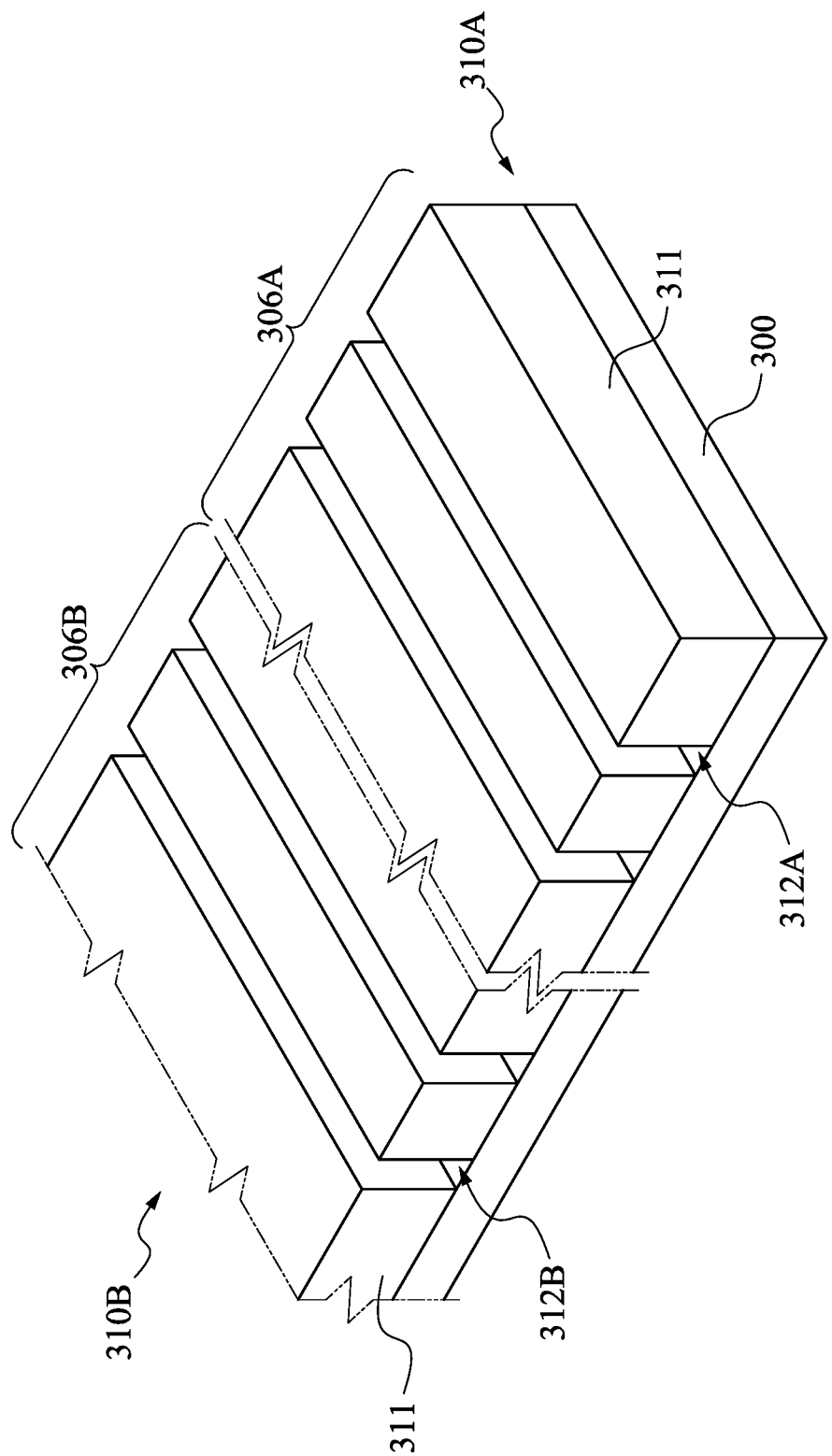
FIGS. 5-8 are the perspective views of the intermediate stages of the fabrication of overlay structures according to some embodiments of the present disclosure.

Referring to FIG. 5, in step S1, a substrate 300 is provided. The substrate 300 may be a semiconductor wafer (e.g., wafer 300 in FIG. 3B), or any base material on which processing is conducted to produce layers of material, pattern features, and/or integrated circuits. The substrate 300 includes an overlay region 306A for forming an overlay structure 310A and an overlay region 306B for forming an overlay structure 310B. In some embodiments, the overlay region 306A may correspond to a portion of a wafer such as the region A in the first zone 301A as illustrated in FIG. 3B, and the overlay region 306B may correspond to a portion of a wafer such as the region B in the second zone 301B as illustrated in FIG. 3B.

A first dielectric layer 311 is formed on the substrate 300. The first dielectric layer 311 is formed by any suitable technique including spin-on, physical vapor deposition (PVD), chemical vapor deposition (CVD), high density plasma CVD (HDP-CVD), and atomic layer deposition (ALD) and may be formed to any suitable depth.

Materials for the first dielectric layer 311 may include may be classified as traditional dielectrics, high-k dielectric materials, low-K (LK), extreme low-K (ELK), and/or extra low-k(XLK) materials. Traditional dielectrics include silicon oxide, silicon nitride, silicon oxynitride, and/or combinations thereof. Examples of high-k dielectric material include Hfo, HfSiO, HfSiON, HfTaO, HfsiO, HfZrO, Zirconium oxide, aluminum oxide, hafnium dioxide-alumina ($H_2O$. Al—O.) alloy, and/or combinations thereof. LK, ELK, and/or XLK dielectric materials include materials such as silicon nitride, silicon oxynitride, spin-on glass (SOG), undoped silicate glass (USG), fluorinated silica glass (FSG), carbon doped silicon oxide (e.g., SiCOH), carbon-containing material, Black Diamond® (Applied Materials of Santa Clara, Calif.), Xerogel, Aerogel, amorphous fluorinated carbon, Parylene, BCB (bisbenzocyclobutenes), Flare, SiLK (Dow Chemical of Midland, Mich.), polyimide, other suitable dielectric materials, and/or combinations thereof.

After the formation of the first dielectric layer 311, a layer of photoresist (not shown) is applied to the top surface of the first dielectric layer 311. One embodiment of the photomask 200 (see FIG. 3A) is used in a photolithography process to transfer an overlay pattern to the photoresist layer. An etch is then performed to transfer the overlay pattern on the photoresist layer to the first dielectric layers 311 to form trenches 312A in the overlay region 306A and form trenches 312B in the overlay region 306B. In various embodiments, the etch process may include any suitable anisotropic or isotropic etchings such as a wet etching processes, a dry etching processes, ashing and/or combinations thereof. The etching processes may also use a reactive ion etch (RIE) and/or other suitable process.

Figure 6:
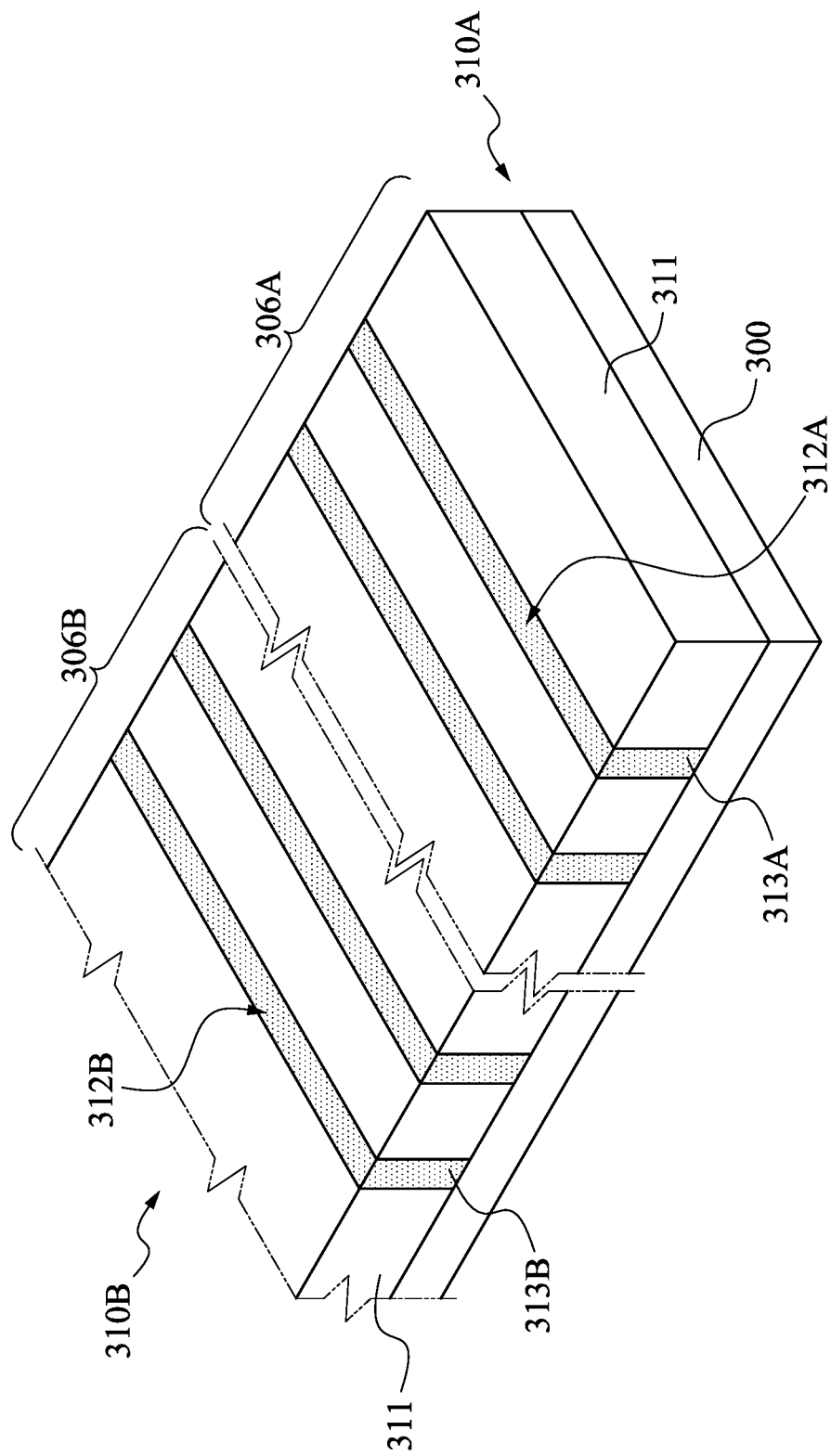

Referring to FIG. 6, in step S2, metal line 313A and 313B are formed in the trench 312A and 312B. In some embodiments, in the formation of the metal line 313A and 313B, a metal layer is formed on the first dielectric layer 311 and in the trenches 312A and 312B, and then a planarization process is performed on the first dielectric layer 311 and the metal layer, such as a chemical mechanical polishing (CMP) process.

Figure 7:
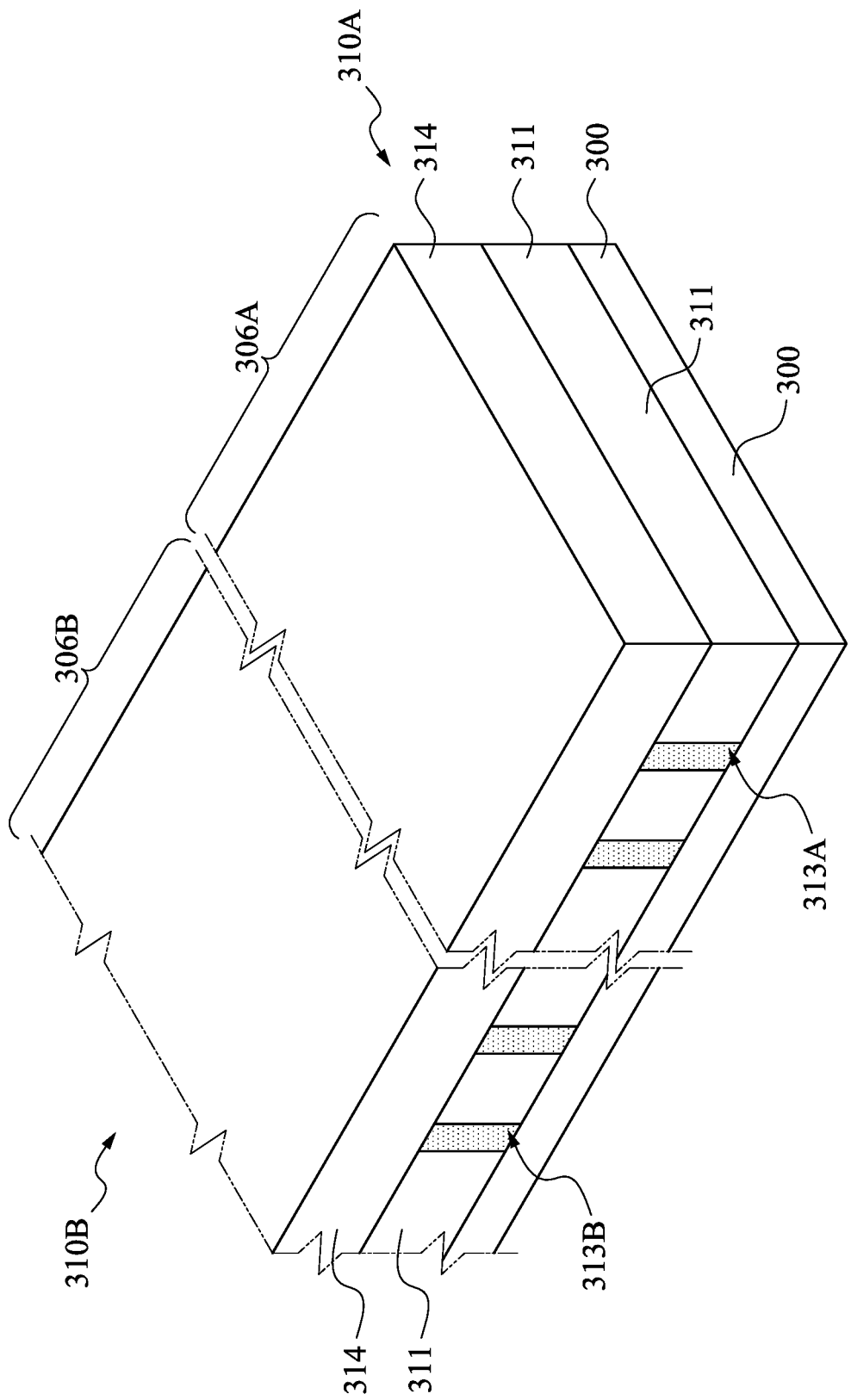

Referring to FIG. 7, in step S3, a second dielectric layer 314 is formed on the first dielectric layer 311 and the metal line 313A and 313B. The first dielectric layer 311 is formed by any suitable technique including spin-on, physical vapor deposition (PVD), chemical vapor deposition (CVD), high density plasma CVD (HDP-CVD), and atomic layer deposition (ALD) and may be formed to any suitable depth.

Figure 8:
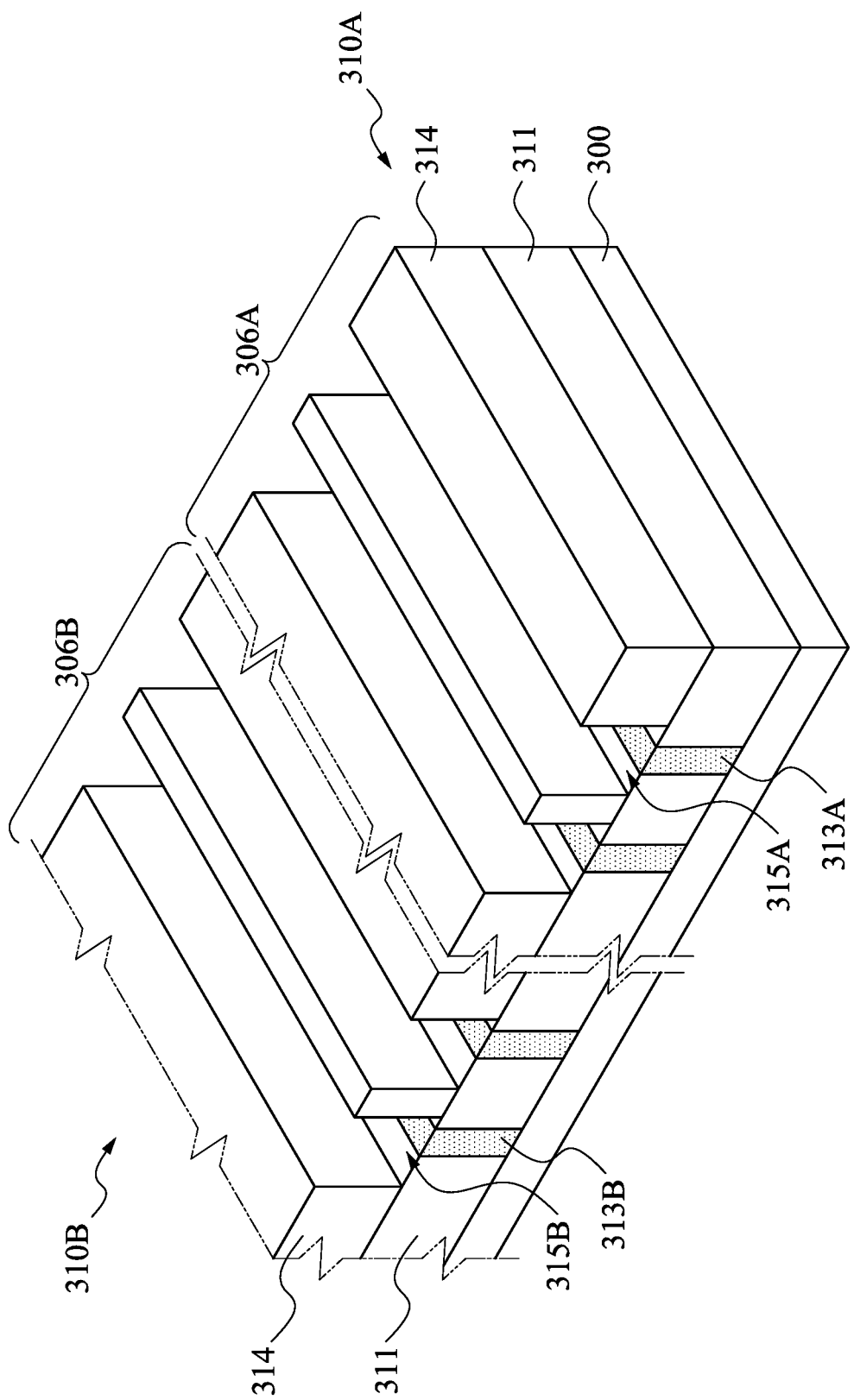

Referring to FIG. 8, in step S4, another layer of photoresist (not shown) is applied to the top surface of the second dielectric layer 314. Another embodiment of the photomask 200 (see FIG. 3A) is used in a photolithography process to transfer an overlay pattern to the photoresist layer. An etch is then performed to transfer the overlay pattern on the photoresist layer to the second dielectric layers 314 to form trenches 315A in the overlay region 306A and form trenches 315B in the overlay region 306B. In various embodiments, the etch process may include any suitable anisotropic or isotropic etchings such as a wet etching processes, a dry etching processes, ashing and/or combinations thereof. The etching processes may also use a reactive ion etch (RIE) and/or other suitable process. As a result, the metal line 313A is exposed by the trench 315A, and the metal line 313B is exposed by the trench 315B.

It is noted that, in some embodiments as illustrated in FIG. 8, the trench 315A may expose two portions of the first dielectric layer 311 located at two opposites of the metal line 313A, and the trench 315B may expose two portions of the first dielectric layer 311 located at two opposites of the metal line 313B. That is, two portions of the trench 315A are not aligned with the metal line 313A, and two portions of the trench 315B are not aligned with the metal line 313B. The area of these two portions of the trench 315A may substantially be the same or close, while the area of these two portions of the trench 315B may be different. As a result, as described in FIG. 1, the images of the overlay structure 310A and 310B can be acquired and be processed to quantify these two portions of the bottom area of the trench 315A and these two portions of the bottom area of the trench 315B (or may be considered as two portions of the first dielectric layer 311 at opposite sides of the metal line 313A and the metal line 313B), as will be described in detail with reference made to FIG. 9A-13B according to the present embodiment and some other embodiments of the present disclosure.

Referring to FIG. 9A and FIG. 9B, in step S5, the overlay shift between the metal line 313B and the trench 315B is quantified. FIG. 9A may be a top view of a SEM image intends to capture, and FIG. 9B may be a cross section view of a SEM image intends to capture. As illustrated in FIG. 9A, a first portion 3112B and a second portion 3114B of the first dielectric layer 311 are exposed through the trench 315B. As illustrated in FIG. 9B, a first portion 3152B and a second portion 3154B of the trench 315B are not aligned with the metal line 313B, but are aligned with the first portion 3112B and the second portion 3114B of the first dielectric layer 311, respectively. In some embodiments, as discussed in FIG. 1, one way to determine the overlay shift between the metal line 313B and the trench 315B (or the first dielectric layer 311 and the second dielectric layer 314), is quantifying the sizes of the first portion 3112B and the second portion 3114B of the first dielectric layer 311 (or the first portion 3152B and the second portion 3154B of the trench 315B).

Referring still to FIG. 9A and FIG. 9B, a first dimension L1 of the first portion 3152B and a second dimension L2 of the second portion 3154B of the bottom surface of the trench 315B measured along a first direction D1 are determined. The first direction D1 is perpendicular to a direction D2 in which the metal line 313B extends. It is noted that the first dimension L1 is the same as a dimension of the top surface of the first portion 3112B of the first dielectric layer 311 measured along the first direction D1, and the second dimension L2 is the same as a dimension of the top surface of the second portion 3114B of the first dielectric layer 311 measured along the first direction D1. The difference between the first dimension L1 and the second dimension L2 can be determined as the overlay shift between the metal line 313B and the recess 315B along the first direction D1.

In other words, if the first dimension L1 is substantially equal to the second dimension L2, then the overlay between the metal line 313B and the trench 315B may be deemed to be close to being ideal. If the first dimension L1 is substantially greater than, or smaller than the second dimension L2, then the overlay between the metal line 313B and the trench 315B may be deemed to be poor and may need correction or compensation. It is understood that some difference will exist between the first dimension L1 and the second dimension L2 in real world fabrication, but as long as their difference is less than a predetermined threshold, then the overlay between the metal 313B and the trench 315B may be deemed acceptable (even though an overlay issue exists).

Referring to FIG. 10, in step S6, the overlay shift is compensated. It is noted that, although merely overlay region 306B are shown in FIG. 9A and FIG. 9B, the overlay structures 310A and 310B located at the whole regions of the wafer (e.g., the first zone 301A and the second zone 301B of the wafer 300 in FIG. 3B) can be determined. As a result, the large overlay shift at the wafer edge due to the wafer warpage can be visualized and quantified. In some embodiments, the second zone 301B is the region of the wafer 300 where the overlay shift value increased rapidly and is greater than the overlay shift value in the first zone 301A. An average of the overlay shift derived from the overlay structures 310B located at the second zone 301B is used to correct the overlay shift caused by the wafer warpage at the second zone 301B. As illustrated in FIG. 10, a third dielectric layer 316 is formed above the second dielectric layer 314, and a trench 317B is formed in the third dielectric layer 316. After the compensation for the process parameter applied for the third dielectric layer 316 and the trench 317B, the location of the trench 317B is corrected to mostly align with the metal line 313B in the first dielectric layer 311. It is understood that the trench 317B is merely an exemplary structure for representing the overlay compensation result. In some other embodiments, the trench 317B may be other structures.

Figure 11A:
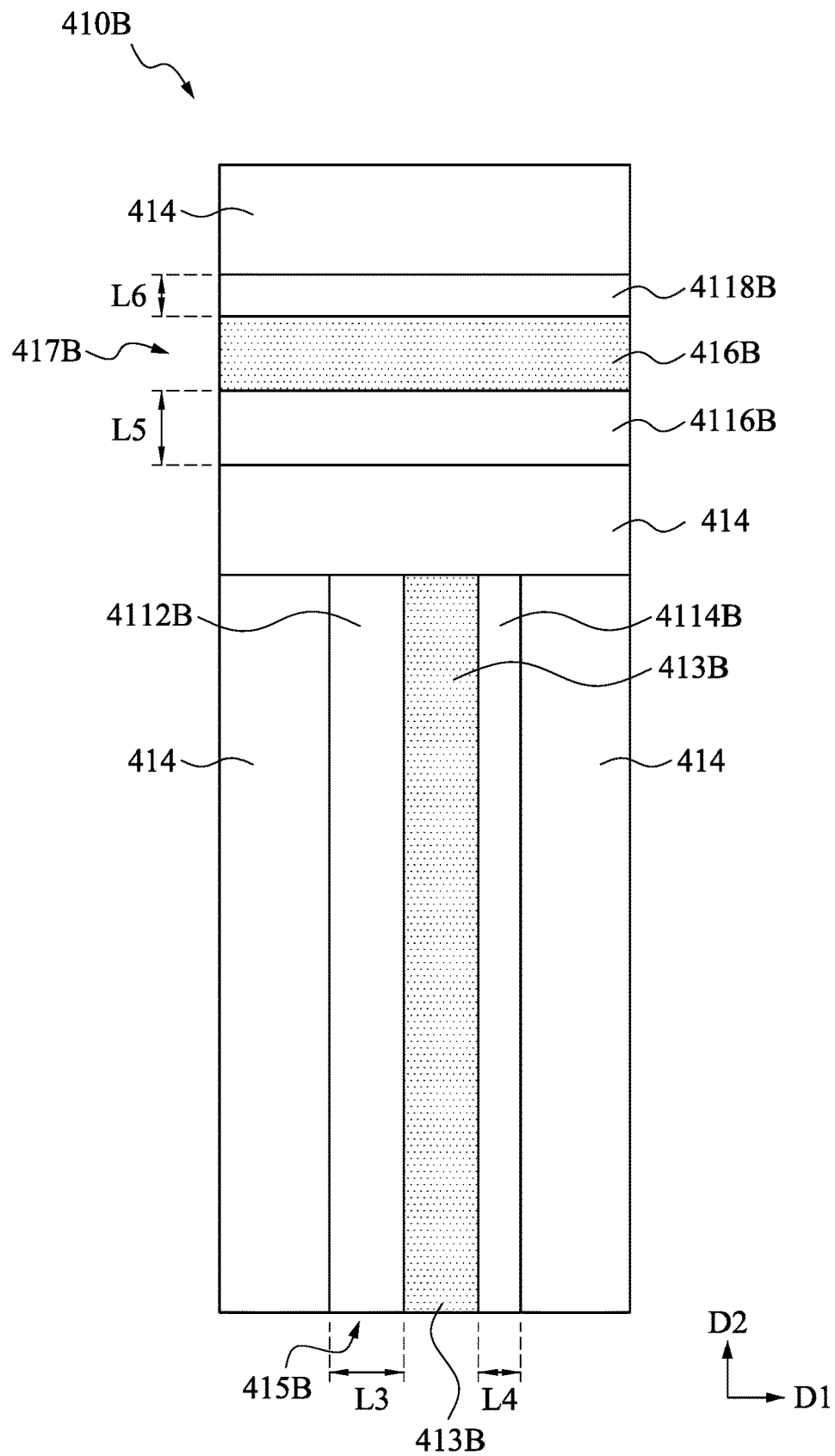
FIG. 11A is a top view of an overlay structure according to some embodiments of the present disclosure.
Figure 11B:
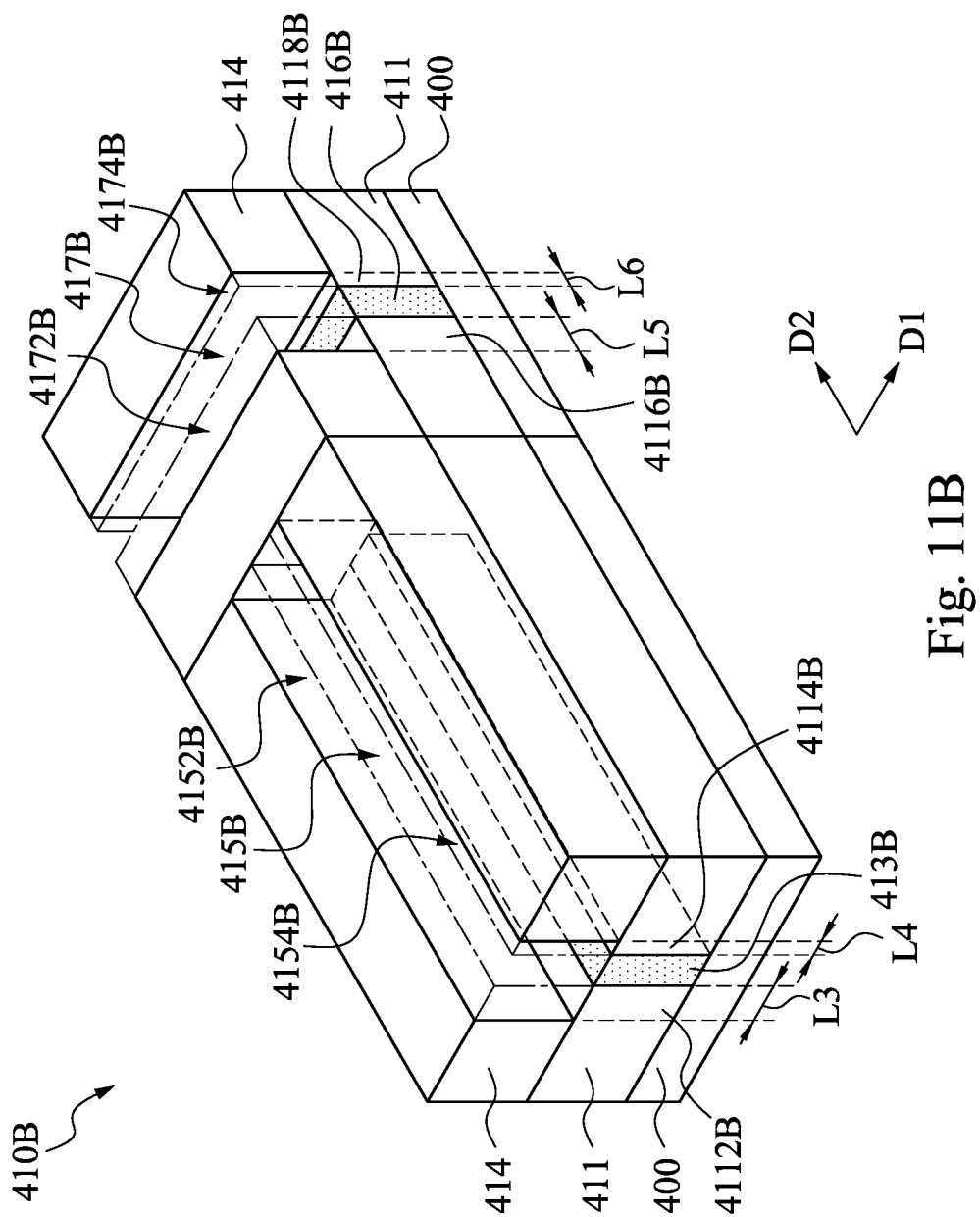
FIG. 11B is a perspective view of the overlay structure in FIG. 11A.

FIG. 11A is a top view of an overlay structure 410B according to some embodiments of the present disclosure. FIG. 11B is a perspective view of the overlay structure 410B in FIG. 11A. The overlay structure 410B includes a metal line 413B extends in the direction D2 and a metal line 416B extends in the direction D1 disposed in the first dielectric layer 411. A trench 415B extends in the direction D2 is disposed in a second dielectric layer 414 above the metal line 413B and exposes the metal line 413B. A trench 417B extends in the direction D1 is disposed in the second dielectric layer 414 above the metal line 416B and exposes the metal line 416B. That is, the overlay structure 410B is a combination of an overlay structures 310B and another overlay structures 310B oriented 90 degree.

As illustrated in FIG. 11A, a third portion 4112B and a fourth portion 4114B of the first dielectric layer 411 are exposed from the trench 415B. A fifth portion 4116B and a sixth portion 4118B of the first dielectric layer 411 are exposed from the trench 417B. As illustrated in FIG. 11B, a first portion 41528 and a second portion 4154B of the trench 415B are not aligned with the metal line 413B, but are aligned with the third portion 4112B and the fourth portion 4114B of the first dielectric layer 411, respectively. A third portion 4172B and a fourth portion 4174B of the trench 417B are not aligned with the metal line 416B, but are aligned with the fifth portion 4116B and the sixth portion 4118B, respectively.

A third dimension L3 of the third portion 4152B and a fourth dimension L4 of the fourth portion 4154B of the bottom surface of the trench 415B measured along the first direction D1 are determined. It is noted that the third dimension L3 is the same as a dimension of the top surface of the third portion 4112B of the first dielectric layer 411 measured along the first direction D1, and the fourth dimension L4 is the same as a dimension of the top surface of the fourth portion 4114B of the first dielectric layer 411 measured along the first direction D1. The difference between the third dimension L3 and the fourth dimension L4 can be determined as the overlay shift between the metal line 413B and the trench 415B along the first direction D1.

Similarly, a fifth dimension L5 of the fifth portion 4172B and a sixth dimension L6 of the sixth portion 4174B of the bottom surface of the trench 417B measured along the second direction D2 are determined. It is noted that the fifth dimension L5 is the same as a dimension of the top surface of the fifth portion 4116B of the first dielectric layer 411 measured along the second direction D2, and the sixth dimension L6 is the same as a dimension of the top surface of the sixth portion 4118B of the first dielectric layer 411 measured along the second direction D2. The difference between the fifth dimension L5 and sixth dimension L6 can be determined as the overlay shift between the metal line 416B and the trench 417B along the second direction D2.

FIG. 12A is a top view of an overlay structure 510B according to some embodiments of the present disclosure. FIG. 12B is a perspective view of the overlay structure 510 in FIG. 12A. The overlay structure 510B includes a metal line 513B extends in the direction D2 disposed in a first dielectric layer 511 and a via hole 515B disposed in a second dielectric 514. As illustrated in FIG. 12A, a first portion 5112B and a second portion 5114B of the first dielectric layer 511 are exposed from the via hole 515B. As illustrated in FIG. 12B, a first portion 5152B and a second portion 5154B of the via hole 515B are not aligned with the metal line 513B, but are aligned with the first portion 5112B and the second portion 5114B of the first dielectric layer 511, respectively.

A first dimension L1 of the first portion 5152B and a second dimension L2 of the second portion 5154B of the bottom surface of the via hole 515B (or the top surface of the first portion 5112B and the second portion 5114B of the first dielectric layer 511) measured along the first direction D1 are determined. The difference between the first dimension L1 and the second dimension L2 can be determined as the overlay shift between the metal line 513B and the via hole 515B along the first direction D1.

Figure 13A:
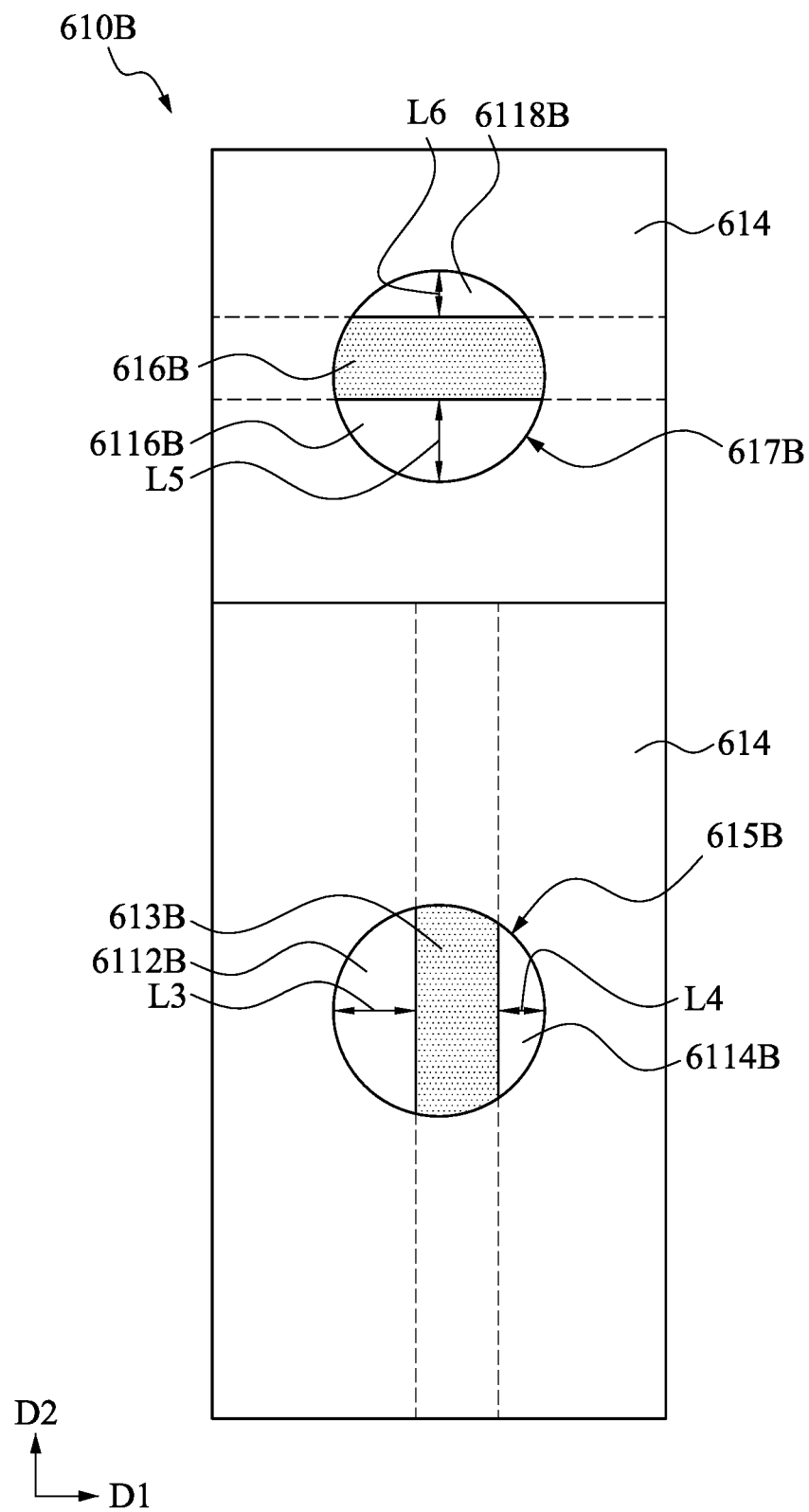
FIG. 13A is a top view of an overlay structure according to some embodiments of the present disclosure.
Figure 13B:
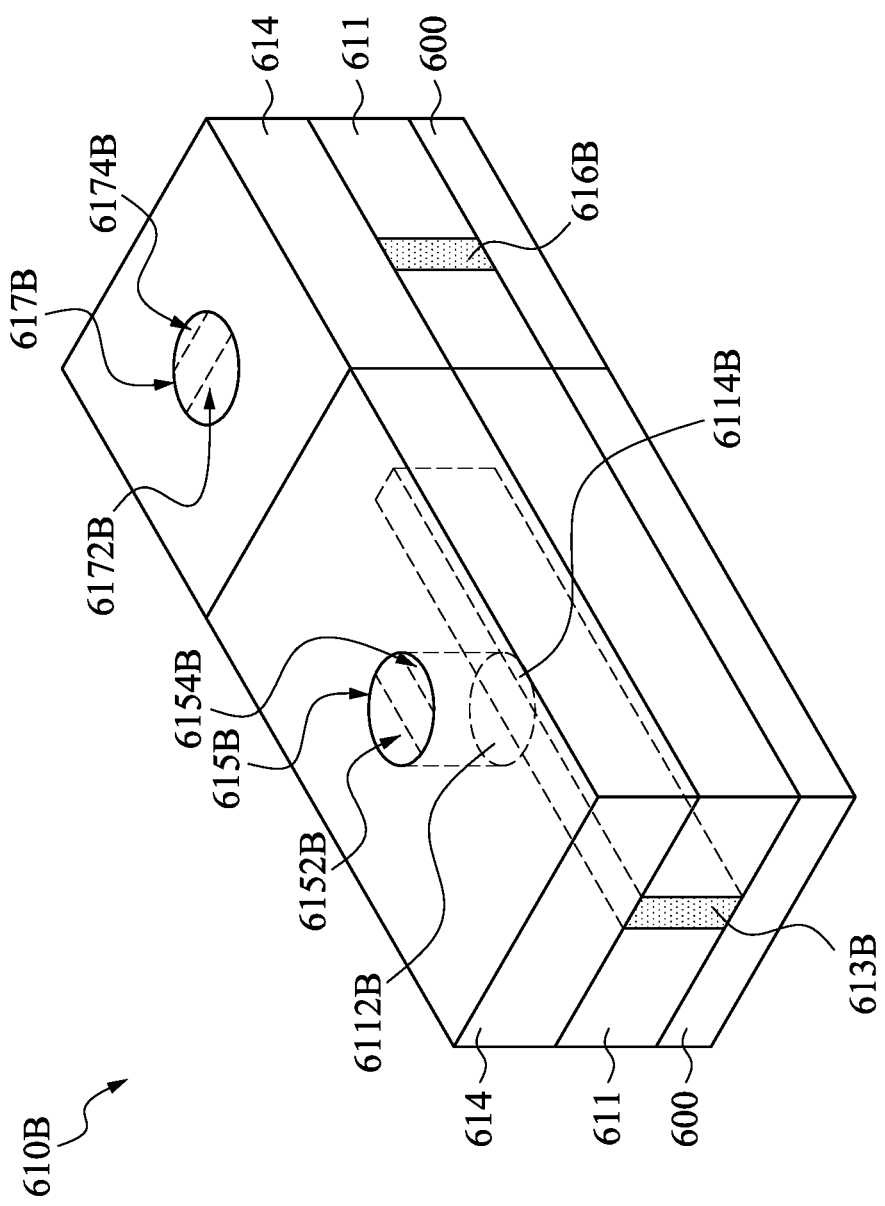
FIG. 13B is a perspective view of the overlay structure in FIG. 13A.

FIG. 13A is a top view of an overlay structure 610B according to some embodiments of the present disclosure. FIG. 13B is a perspective view of the overlay structure 610 B in FIG. 13A. The relation between the overlay structure 610B and the overlay structure 510B is similar to the relation between the overlay structure 410B and the overlay structure 310B. Thus, as described above, a third dimension L3 of a third portion 6152B and a fourth dimension L4 of a fourth portion 6154B of the bottom surface of a trench 615B (or a top surface of a third portion 6112B and a fourth portion 6114B of a first dielectric layer 611) measured along the first direction D1 and a fifth dimension L5 of a fifth portion 6172B and a sixth dimension L6 of a six portion 6174B of the bottom surface of a trench 617B (or the top surface of the fifth portion 6116B and the six portion 6118B of the first dielectric layer 611) measured along the second direction D2 can be determined. The difference between the third dimension L3 and the fourth dimension L4 can be determined as the overlay shift between the metal line 613B and the via hole 615B along the first direction D1, and the difference between the fifth dimension L5 and the sixth dimension L6 can be determined as the overlay shift between the metal line 616B and the via hole 617B along the second direction D2.

Figure 14B:
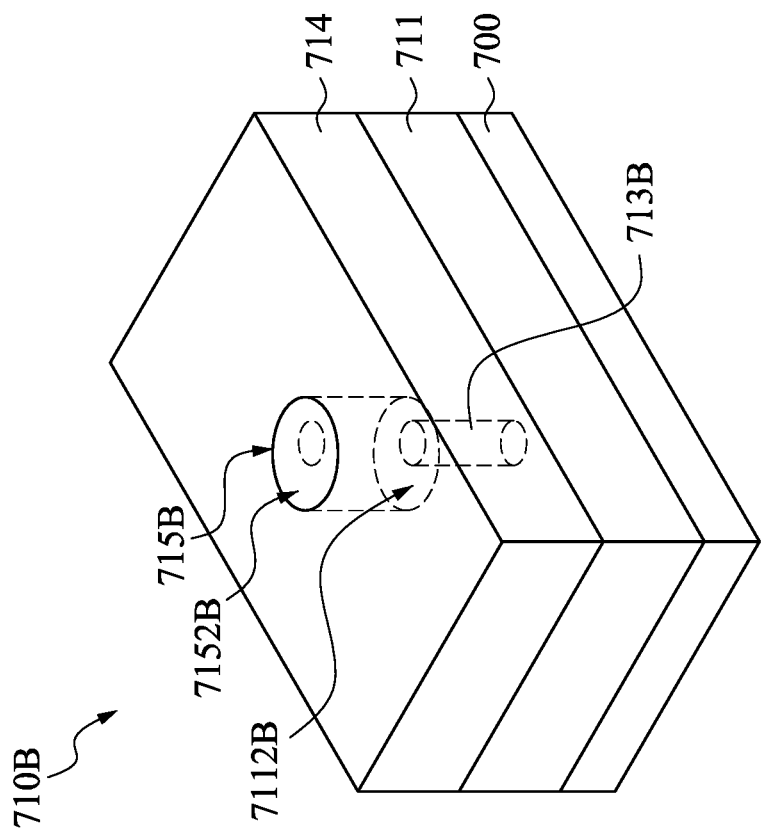
FIG. 14B is a perspective views of the overlay structure in FIG. 14A.
Figure 14A:
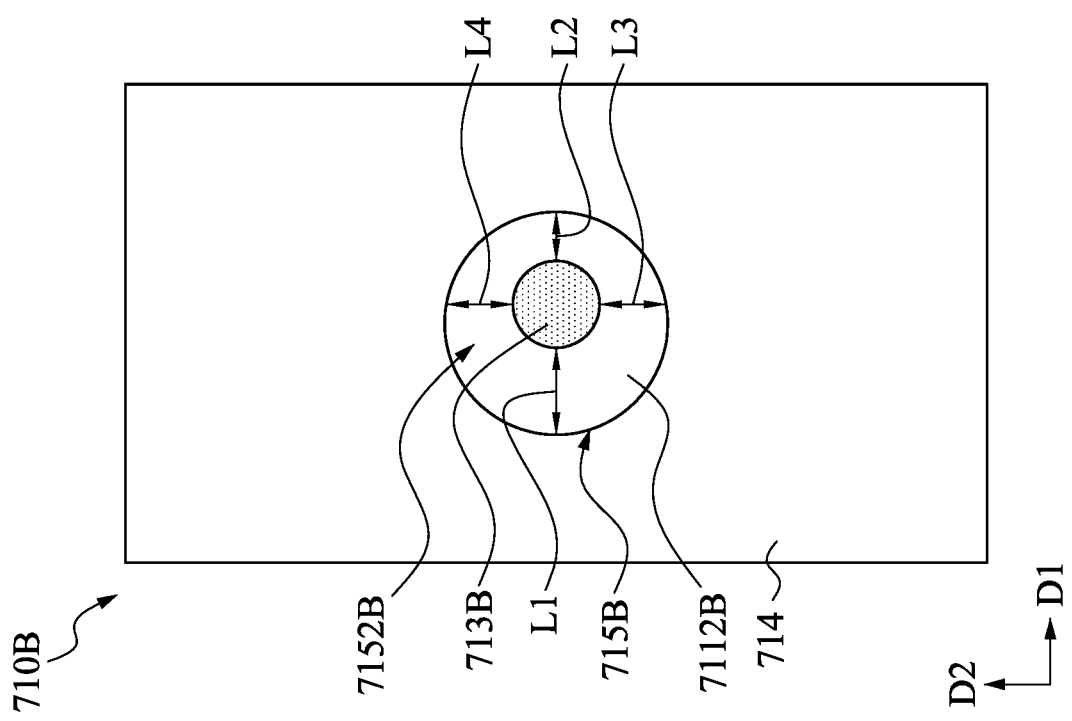
FIG. 14A is a top view of an overlay structure according to some embodiments of the present disclosure.

FIG. 14A is a top view of an overlay structure 710B according to some embodiments of the present disclosure. FIG. 14B is a perspective view of the overlay structure 710B in FIG. 14B. The overlay structure 710B includes a metal cylinder 713B disposed in a first dielectric layer 711 and a via hole 715B disposed in a second dielectric 714. As illustrated in FIG. 14A, a portion 7112B of the first dielectric layer 711 are exposed from the via hole 715B. As illustrated in FIG. 14B, a portion 7152B of the via hole 715B are not aligned with the metal cylinder 713B, but are aligned with the portion 7112B of the first dielectric layer 711. In the embodiment shown in FIG. 14A and FIG. 14B, the portion 7112B of the first dielectric layer and the portion 5152B of the via hole 715B are ring-shaped. A first dimension L1 and a second dimension L2 of the bottom surface of the portion 7152B of the via hole 715B (or the top surface of the portion 7112B of the first dielectric layer 711) measured along the first direction D1 are determined. A third dimension L3 and a fourth dimension L4 of the bottom surface of the portion 7152B of the via hole 715B (or the top surface of the portion 7112B of the first dielectric layer 711) measured along the second direction D2 are determined. The difference between the first dimension L1 and the second dimension L2 can be determined as the overlay shift between the metal cylinder 713B and the via hole 715B along the first direction D1. The difference between the third dimension L3 and the fourth dimension L4 can be determined as the overlay shift between the metal cylinder 713B and the via hole 715B along the second direction D2.

Real overlay shift due to wafer warpage at an edge region of a wafer can be detected and corrected by acquiring and processing an image of the overlay structures, thus the via-induced-metal-bridge problem at the edge region of the wafer can be reduced. The accuracy of the overlay shift can be improved by disposing one or more overlay structures in the scribe lines of each side of a die region of the wafer. The overlay measurement through observing adjacent two layers of the wafer can be applied with various advanced technology. Thus, yield and reliability of the devices are improved.

According to some embodiments of the present disclosure, a method of semiconductor fabrication includes: forming a plurality of overlay structures at scribe lines of a wafer, each side of a die region of the wafer is disposed with at least one of the overlay structures, each of the overlay structures comprises at least one feature and at least one recess disposed above the feature, the feature is disposed at a first layer of the wafer and the recess is disposed at a second layer of the wafer, the recess exposes a portion of the feature that is vertically aligned with the recess; acquiring an image of the overlay structures; measuring a first dimension of a first portion and a second dimension of a second portion of the recess, the first portion and the second portion of the recess are each vertically not aligned with the corresponding features; determining an overlay between the first layer and the second layer of an edge region of the wafer based on an average of differences between the first dimensions and the second dimensions of each of the recesses at the edge region of the wafer; and modifying a subsequent lithography step to compensate for the overlay of the edge region of the wafer.

According to some embodiments of the present disclosure, a method of semiconductor fabrication includes: forming a plurality of overlay structures at scribe lines of a wafer, each side of a die region of the wafer is disposed with at least one of the overlay structures, each of the overlay structures comprises at least one feature and at least one recess disposed above the feature, the feature is disposed at a first layer of the wafer and the recess is disposed at a second layer of the wafer, the recess exposes a portion of the feature that is vertically aligned with the recess; acquiring an image of the overlay structures; measuring a first dimension of a first portion and a second dimension of a second portion of the recess, the first portion and the second portion of the recess are each vertically not aligned with the corresponding features; determining an overlay between the first layer and the second layer based on an difference between the first dimensions and the second dimensions; and modifying a subsequent lithography step to compensate for a third layer disposed above the second layer based on the overlay between the first layer and the second layer.

According to some embodiments of the present disclosure, an apparatus includes a photomask, a semiconductor fabrication tool and one or more hardware processors. The photomask is configured to form an overlay structure in a scribe line of a wafer, the overlay structure includes at least one feature and at least one recess disposed above the feature, the feature is disposed at a first layer of the wafer and the recess is disposed at a second layer of the wafer, the recess exposes a portion of the feature that is vertically aligned with the recess, a first portion of the recess and a second portion of the recess are not vertically aligned with the feature and are disposed on opposite sides of the feature. The semiconductor fabrication tool is configured to acquire an image of the scribe line of the wafer. The one or more hardware processors is configured to execute instructions to perform operations that include: processing the acquired image; measuring a first dimension of the first portion of the recess and a second dimension of the second portion of the recess; determining an overly between the first layer and the second layer based on the first dimensions and the second dimensions; and modifying a subsequent lithography step to compensate for a third layer disposed above the second layer based on the overlay between the first layer and the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor fabrication, comprising:
    forming a plurality of overlay structures at scribe lines of a wafer, and each side of a die region of the wafer is disposed with at least one of the overlay structures, wherein each of the overlay structures comprises at least one feature and at least one recess disposed above the feature, the feature is disposed at a first layer of the wafer and the recess is disposed at a second layer of the wafer, and the recess exposes a portion of the feature that is vertically aligned with the recess;
    acquiring an image of the overlay structures;
    measuring a first dimension of a first portion and a second dimension of a second portion of the recess, wherein the first portion and the second portion of the recess are each vertically not aligned with the corresponding features;
    determining an overlay between the first layer and the second layer of an edge region of the wafer based on an average of differences between the first dimensions and the second dimensions of each of the recesses at the edge region of the wafer; and
    modifying a subsequent lithography step to compensate for the overlay of the edge region of the wafer.

2. The method of claim 1, wherein the forming overlay structures are carried out such that the at least one feature comprises a first and second line structures, the at least one recess comprises a first and second trenches, the first line structure and the first trench extend along a first direction, and the second line structure and the second trench extend along a second direction perpendicular to the first direction.

3. The method of claim 2, wherein the first dimension of the first portion and the second dimension of the second portion of the first trench are measured along the second direction, and a third dimension of the first portion and a fourth dimension of the second portion of the second trench are measured along the first direction.

4. The method of claim 1, wherein the forming overlay structures are carried out such that the at least one feature comprises a first and second line structures, the at least one recess comprises a first and second via holes, the first line structure extends along a first direction, and the second line structure extends along a second direction perpendicular to the first direction.

5. The method of claim 4, wherein the first dimension of the first portion and the second dimension of the second portion of the first via hole are measured along the second direction, and a third dimension of the first portion and a fourth dimension of the second portion of the second via hole are measured along the first direction.

6. The method of claim 1, wherein the forming overlay structures are carried out such that the at least one feature comprises a metal cylinder, the at least one recess comprises a via hole, the first dimension and the second dimension of via hole are measured along a first direction, and a third dimension and a fourth dimension of the via hole are measured along a second direction perpendicular to the first direction.

7. The method of claim 6, wherein a compensation value for the edge region of the wafer is greater than compensation values for the other regions of the wafer.

8. A method of semiconductor fabrication, comprising:
    forming a plurality of overlay structures at scribe lines of a wafer, and each side of a die region of the wafer is disposed with at least one of the overlay structures, wherein each of the overlay structures comprises at least one feature and at least one recess disposed above the feature, the feature is disposed at a first layer of the wafer and the recess is disposed at a second layer of the wafer, and the recess exposes a portion of the feature that is vertically aligned with the recess;
    acquiring an image of the overlay structures;
    measuring a first dimension of a first portion and a second dimension of a second portion of the recess, wherein the first portion and the second portion of the recess are each vertically not aligned with the corresponding features;
    determining an overlay between the first layer and the second layer based on an difference between the first dimensions and the second dimensions; and
    modifying a subsequent lithography step to compensate for a third layer disposed above the second layer based on the overlay between the first layer and the second layer.

9. The method of claim 8, wherein the forming overlay structures are carried out such that each of the overlay structures comprises a first and a second features and a first and a second recesses, the first and the second features are line structures and the first and the second recess are trenches, the first feature and the first recess extend along a first direction, and the second feature and the second recess extend along a second direction perpendicular to the first direction.

10. The method of claim 9, wherein the first dimension of the first portion and the second dimension of the second portion of the first recess are measured along the second direction, and a third dimension of the first portion and a fourth dimension of the second portion of the second recess are measured along the first direction.

11. The method of claim 8, wherein the forming overlay structures are carried out such that each of the overlay structures comprises a first and a second features and a first and a second recesses, the first and the second features are line structures and the first and the second recess are via holes, the first feature extends along a first direction, and the second feature extends along a second direction perpendicular to the first direction.

12. The method of claim 11, wherein the first dimension of the first portion and the second dimension of the second portion of the first recess are measured along the second direction, and a third dimension of the first portion and a fourth dimension of the second portion of the second recess are measured along the first direction.

13. The method of claim 8, wherein the forming overlay structures are carried out such that each of the overlay structures comprises a feature a recess, the feature is a metal cylinder and the recess is a via hole, the first dimension and the second dimension of recess are measured along a first direction, and the third dimension and the fourth dimension of the recess are measured along a second direction perpendicular to the first direction.

14. The method of claim 8, wherein a compensation value for an edge region of the wafer is greater than compensation values for the other regions of the wafer.

15. A method of semiconductor fabrication, comprising:
forming a plurality of overlay structures at scribe lines of a wafer, and each side of a die region of the wafer is disposed with at least one of the overlay structures, wherein each of the overlay structures comprises at least one feature in a first dielectric layer and at least one recess disposed in a second dielectric layer above the first dielectric layer, and the recess exposes a portion of the feature that is vertically aligned with the recess;

determining an overlay between the first dielectric layer and the second dielectric layer through dimensions of two portions of the first dielectric layer exposed from the recess based on an image of the overlay structure, wherein the two portions of the first dielectric layer are located at two opposite sides of the portion of the feature; and forming another recess in a third dielectric layer of the wafer disposed above the second dielectric layer based on the overlay such that the location of the recess in the third dielectric layer is corrected to be aligned with the feature.

16. The method of semiconductor fabrication of claim 15, wherein the overlay between the first dielectric layer and the second dielectric layer is determined from a difference between the dimensions of the two portions of the first dielectric layer.

17. The method of semiconductor fabrication of claim 15, wherein an overlay of an edge region of the wafer is corrected based on an average of differences between portions of the first dielectric layer exposed from each of the recesses at the edge region of the wafer.

18. The method of semiconductor fabrication of claim 15, wherein the forming overlay structures are carried out such that the recess has a first portion and a second portion vertically not aligned with the corresponding feature.

19. The method of semiconductor fabrication of claim 15, wherein the forming overlay structures are carried out such that each of the overlay structures comprises a first and a second features and a first and a second recesses, the first and the second features are line structures, the first and the second recess are trenches or via holes, the first feature extends along a first direction, and the second feature extends along a second direction perpendicular to the first direction.

20. The method of semiconductor fabrication of claim 15, wherein the forming overlay structures are carried out such that each of the overlay structures comprises a feature a recess, the feature is a metal cylinder and the recess is a via hole, the first dimension and the second dimension of recess are measured along a first direction, and the third dimension and the fourth dimension of the recess are measured along a second direction perpendicular to the first direction.

* * * * *